United States Patent
Park et al.

(10) Patent No.: US 8,766,349 B2
(45) Date of Patent: Jul. 1, 2014

(54) SEMICONDUCTOR DEVICE HAVING STACKED ARRAY STRUCTURE, NAND FLASH MEMORY ARRAY USING THE SAME AND FABRICATION THEREOF

(75) Inventors: Byung Gook Park, Seoul (KR); Jang Gn Yun, Daejeon (KR); Il Han Park, Seoul (KR)

(73) Assignee: Seoul National University R&DB Foundation (KR)

( * ) Notice: Subject to any disclaimer, the term of this patent is extended or adjusted under 35 U.S.C. 154(b) by 88 days.

(21) Appl. No.: 13/383,097

(22) PCT Filed: Dec. 22, 2009

(86) PCT No.: PCT/KR2009/007663
§ 371 (c)(1),
(2), (4) Date: Jan. 9, 2012

(87) PCT Pub. No.: WO2011/004945
PCT Pub. Date: Jan. 13, 2011

(65) Prior Publication Data
US 2012/0117316 A1    May 10, 2012

(30) Foreign Application Priority Data
Jul. 9, 2009  (KR) .................. 10-2009-0062653

(51) Int. Cl.
*H01L 29/76*    (2006.01)

(52) U.S. Cl.
USPC .......................... 257/314; 257/315; 257/316

(58) Field of Classification Search
USPC ................................................ 257/314–318
See application file for complete search history.

(56) References Cited

U.S. PATENT DOCUMENTS

| | | | |
|---|---|---|---|
| 5,965,914 A | 10/1999 | Miyamoto | |
| 2003/0214835 A1 | 11/2003 | Nejad et al. | |
| 2005/0189583 A1 | 9/2005 | Kim et al. | |
| 2007/0176214 A1 | 8/2007 | Kwon et al. | |
| 2009/0179250 A1* | 7/2009 | van der Zanden et al. | ... 257/315 |

FOREIGN PATENT DOCUMENTS

JP    11-8390    1/1999

* cited by examiner

*Primary Examiner* — Samuel Gebremariam
(74) *Attorney, Agent, or Firm* — Gerald E. Hespos; Michael J. Porco; Matthew T. Hespos

(57) ABSTRACT

The present invention relates to a semiconductor device, a memory array and a fabrication method thereof, and more particularly to a semiconductor device having a stacked array structure (referred to as a STAR structure: a STacked ARray structure) applicable to not only a switch device but also a memory device, a NAND flash memory array using the same as a memory device and a fabrication method thereof.

14 Claims, 13 Drawing Sheets

SEMICONDUCTOR DEVICE HAVING STACKED ARRAY STRUCTURE, NAND FLASH MEMORY ARRAY USING THE SAME AND FABRICATION THEREOF

BACKGROUND OF THE INVENTION

1. Field of the Invention

The present invention relates to a semiconductor device, a memory array and a fabrication method thereof, and more particularly to a semiconductor device having a stacked array structure (hereinafter referred to as a STAR structure: a STacked ARray structure) applicable to not only a switch device but also a memory device, a NAND flash memory array using the same as a memory device and a fabrication method thereof.

2. Description of the Related Art

Currently, most MOSFETs used as a switch device have a planar type structure which takes up a lot of space to make a switch device of a memory array such as a 1T-DRAM etc. and there has been a limitation on a high integration of the memory array.

Also, most memory devices used as a memory cell have a planar type structure and have the above mentioned problem.

Particularly, since the high integration of a NAND flash memory array is easier than that of a NOR type, the NAND flash memory array is becoming popular as a mass nonvolatile memory. But there has been a limitation on the high integration of the memory array by using a planar type memory cell.

To overcome the limitation of the planar type memory cell, various forms of memory devices having a vertical channel have being developed. However, so far, because the developed memory cells with a vertical channel are connected between bit lines of a single layer and word lines, it causes a problem that has a limitation on the high integration of a NAND flash memory array.

Furthermore, a conventional NAND flash memory array has a relatively weak effect on a channel of a memory cell. And it has a disturbance problem induced by an adjacent cell which shares a word line in an unselect bit line and a delay problem of an erasing speed due to the back tunneling.

To solve the problems of the conventional technology, an objective of the present invention is to provide a semiconductor device having a stacked array (STAR) structure which enables to widen a channel width of a vertical channel without limit and to form a single gate (SG), a double gate (DG) and a gate all around (GAA) as occasion demands.

In addition, another objective of the present invention is to provide a NAND flash memory array using the semiconductor device having a STAR structure as a memory cell, specifically, with the gate all around (GAA) structure by consisting of vertically stacked bit lines with memory cells connected in series and word lines wrapping around and sharing the several bit line layers, and to provide a fabrication method of the same.

SUMMARY OF THE INVENTION

To accomplish the objectives, a semiconductor device having a STAR structure according to the present invention is characterized by comprising: one or more stacked semiconductor layers spaced vertically apart from a substrate by a predetermined distance; a gate electrode formed to pass by all of the semiconductor layers and interlaid with a gate insulator on each of the semiconductor layers; source/drain regions formed at both sides of the gate electrode in each of the semiconductor layers; and an interlayer insulator wrapping around the source/drain regions of each of the semiconductor layers or filling a space between the semiconductor layers.

A NAND flash memory array having a STAR structure according to the present invention is characterized by comprising: a plurality of bit lines formed with one or more stacked semiconductor layers spaced vertically and horizontally apart from each other by a predetermined distance on a substrate; a plurality of word lines formed perpendicularly to each of the bit lines, to space horizontally apart from each other by a predetermined distance and to wrap around the semiconductor layers interlaid with insulator layers comprising a charge storage layer; and an interlayer insulator filled between the word lines.

Here, each of the semiconductor layers can have source/drain regions formed by impurity-doped layers or fringing fields at both sides of each of the word lines.

It is preferable that each of the semiconductor layers has a lateral cross section of a shape selected from a quadrangle, a circle and an ellipse, and that each of the word lines passes by to wrap around all lateral sides of each of the semiconductor layers.

In addition, bit select lines can be further formed as many as the number of the vertically stacked semiconductor layers to be spaced horizontally apart from each other by a predetermined distance and to wrap around the semiconductor layers interlaid with the insulator layers or a gate insulator at one side of the word lines; and a source select line can be further formed to wrap around the semiconductor layers interlaid with the insulator layers or a gate insulator at the other side of the word lines.

It is preferable that the portions of the semiconductor layers stacked vertically and wrapped around by each of the bit select lines are doped with an impurity except portions of the same one layer to be selected by each of the bit select lines.

It is preferable that each of the semiconductor layers has one common body region and that the charge storage layer is a nitride layer or a conductive material layer.

A method for fabricating the NAND flash memory array having a STAR structure according to the present invention is characterized by comprising the steps of: (1) forming "semiconductor layer on stack mediate layer" iteratively n times on a predetermined substrate, forming a n+1$^{th}$ stack mediate layer on the n$^{th}$ semiconductor layer, and forming a first etching mask on the n+1$^{th}$ of stack mediate layer; (2) sequentially etching the n+1$^{th}$ stack mediate layer and the n times stacked "semiconductor layer on stack mediate layer" to form bit lines with a pillar-shaped stack structure by using the first etching mask; (3) depositing a groove filling material on the whole surface of the substrate, planarizing to expose the first etching mask, and forming a second etching mask; (4) etching the groove filling material exposed by the second etching mask using the second etching mask to form a partition, exposing the stack structure of step 2 at both sides of the partition, and removing the second etching mask; (5) etching the stack mediate layers of an exposed stack structure to expose only the first etching mask and the semiconductor layers at both sides of the partition; (6) forming insulator layers comprising a charge storage layer on the semiconductor layers exposed at both sides of the partition; (7) depositing a gate material on the whole surface of the substrate, planarizing to expose the first etching mask, and forming word lines by removing the first etching mask; and (8) removing the partition, and filling with an interlayer insulator in a space exposed by removing the partition or forming a separating insulator comprising a charge storage layer on each of the word lines and the semiconductor layers, and filling with a gate material.

ADVANTAGEOUS EFFECTS

According to the configuration of a semiconductor device having the STAR structure, the present invention has an advantageous effect of vertically forming a plurality of semiconductor devices enabling to widen the width of a channel by having a vertical channel region and forming source/drain regions on left and right sides of the channel region and to have one of single gate (SG), double gate (DG) and gate all around (GAA) structures passing by to cross or wrap around one or more of the vertically stacked semiconductor layers and sharing a body with adjacent devices to have a body contact as occasion demands.

Specifically, when the semiconductor device according to the present invention has the gate all around (GAA) structure to wrap around each of the semiconductor layers by one gate electrode for forming a cube or cylinder shaped channel by the cross-sectional shape of each of the semiconductor layers, it is possible to greatly improve controllability to a channel by the gate electrode.

Furthermore, when the semiconductor device with the GAA structure is used as a memory cell, the operation properties of the cell are also greatly improved by a single or multilayer insulator with various radii of curvature interlaid between the gate electrode and each of the semiconductor layers.

A NAND flash memory array using the semiconductor device having the STAR structure as a memory cell according to the present invention has some advantageous effects of enabling to allow high integrity under a given process situation due to the structure of vertically stacked bit lines and to greatly reduce an area of an driver for operating word line by operating several bit line layers by one word line driver.

In addition, because the word line crosses and wrap around the semiconductor layers forming each of bit lines, a memory cell formed between them has the gate all around (GAA) structure. As a result, the controllability of the word line to a channel of each memory cell is improved, and it is possible not only to increase the speed of program, but also to solve a program disturbance of adjacent cells by a self-boosting effect. Specifically, insulator layers including a charge storage layer of cell are formed to have mutually different radii of curvature, and it is possible to greatly improve an erasing speed of memory cell by restraining a back tunneling of electron on erasing.

Furthermore, because source and drain regions of cell are formed by fringing fields of a pass voltage Vpass applied to a word line, it is possible not only to simplify the fabrication process, but also to increase the integrity of memory. Although source/drain and short-circuit regions are formed by an impurity doping, if the inside of each semiconductor layer is not doped, it is possible to erase with a block by enabling a body contact to each semiconductor layer.

In these drawings, the following reference numbers are used throughout: reference numbers 10 and 100 indicate a substrate, 21 and 23 a semiconductor layer or an active body region, 22 a source region, 24 a channel region, 26 a drain region, 40, 41 and 42 a gate insulator, 50, 51, 52 and 53 a gate electrode, 60 an interlayer insulator, 70 and 72 an ion injection space, 200*a* a pillar-shaped stacked structure, 210, 230, 250, 210*a*, 230*a* and 250*a* a stack mediate layer, 220, 240, 220*a*, 240*a*, 220*b* and 240*b* a semiconductor layer, 222, 242, 222*a*, 242*a*, 222*b* and 242*b* an impurity-doped layer for short circuit, 221 and 241*a* first impurity-doped layer for short circuit, 224 and 226 an impurity-doped layer for source/drain, 243 a second impurity-doped layer, 310, 320, 360, 370 and 380 a doping mask, 330 and 340 an etching mask, 420 insulator layers, 500 a gate material (a word line, a bit select line or a source select line), 600 an interlayer insulator, 700 a groove filling material, and 710, 720, 712 and 722 a partition.

DETAILED DESCRIPTION OF THE PREFERRED EMBODIMENTS

A detailed description of preferred embodiments of the present invention is provided below with respect to the accompanying drawings.

Figure 1:
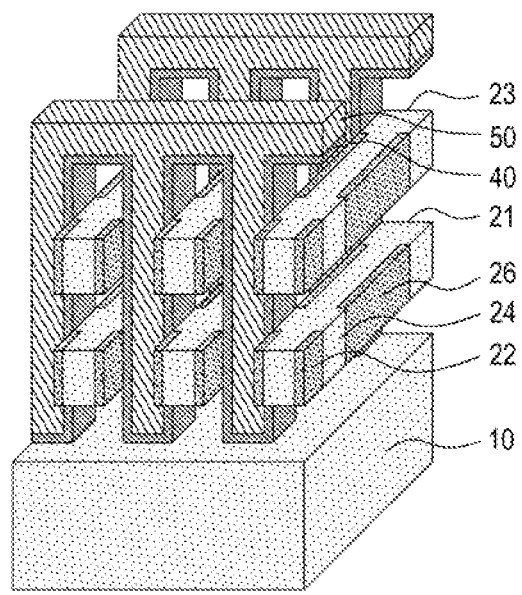
FIGS. 1 and 2 are processing perspective views to show a device structure with a gate electrode 50 passing by and crossing each of semiconductor layers 21 and 23 in an embodiment of a semiconductor device having a STAR structure according to the present invention.
Figure 2:
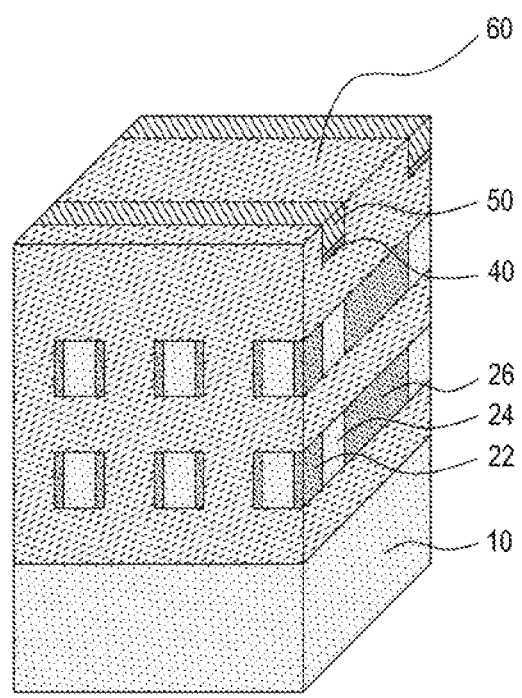
Figure 3:
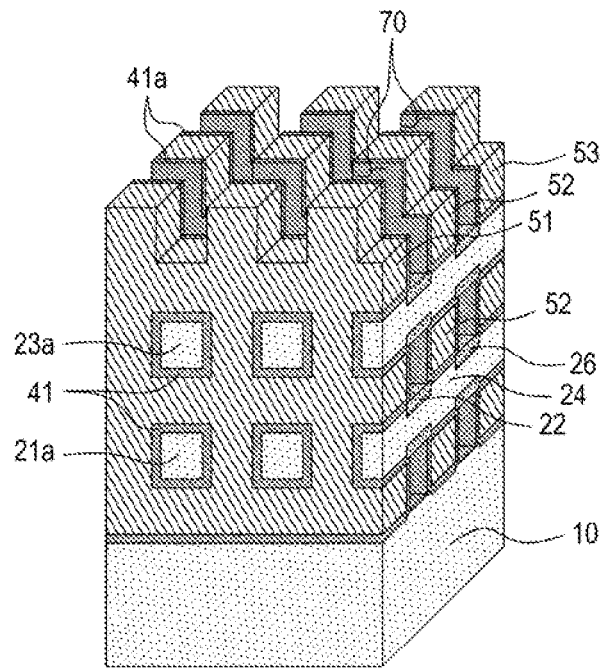
FIGS. 3 and 4 are processing perspective views to show a device structure with gate electrodes 51, 52 and 53 passing by and wrapping around each of semiconductor layers 21*a* and 23*a* in another embodiment of a semiconductor device having a STAR structure according to the present invention.
Figure 4:
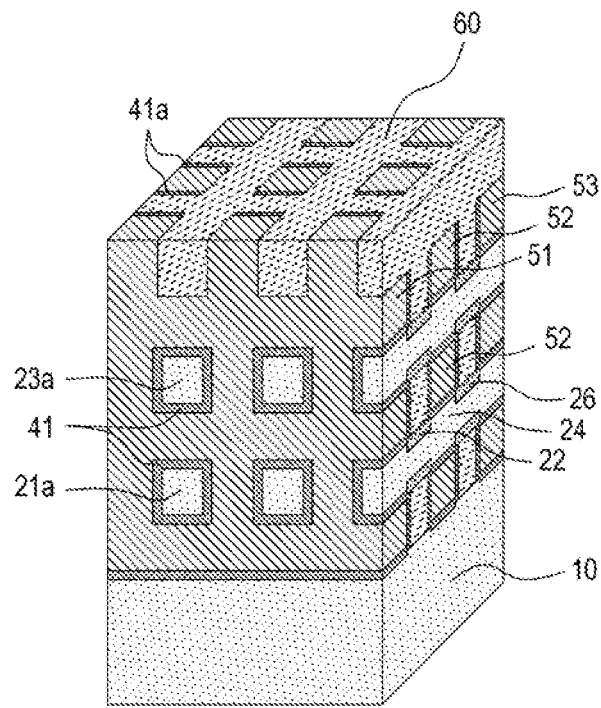
Figure 5:
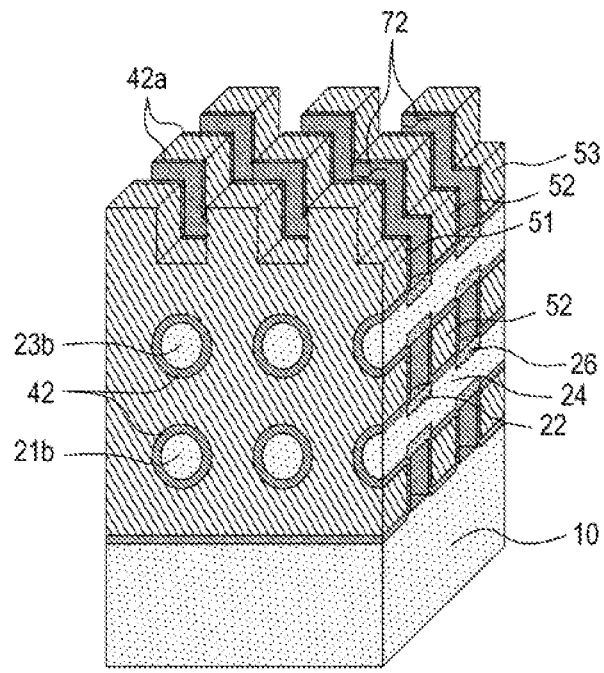
FIGS. 5 and 6 are processing perspective views to show a device structure with a circular cross-section of each of semiconductor layers 21*b* and 23*b* wrapped around by gate electrodes 51, 52 and 53 in another embodiment of a semiconductor device having a STAR structure according to the present invention.
Figure 6:
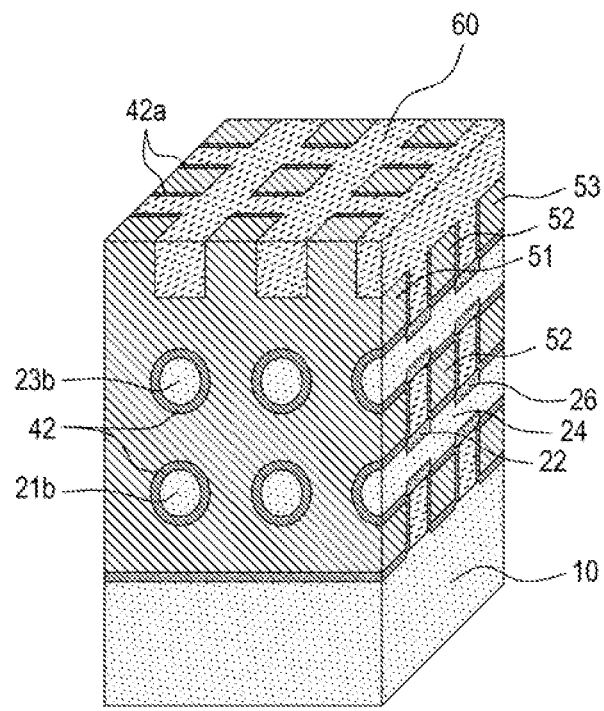

FIGS. 1 and 2 are processing perspective views to show a device structure with a gate electrode 50 passing by and crossing each of semiconductor layers 21 and 23 in an embodiment of a semiconductor device having a STAR structure according to the present invention. FIGS. 3 and 4 are processing perspective views to show a device structure with gate electrodes 51, 52 and 53 passing by and wrapping around each of semiconductor layers 21*a* and 23*a* in another embodiment of a semiconductor device having a STAR structure according to the present invention. FIGS. 5 and 6 are processing perspective views to show a device structure with a circular cross-section of each of semiconductor layers 21*b* and 23*b* wrapped around by gate electrodes 51, 52 and 53 in another embodiment of a semiconductor device having a STAR structure according to the present invention.

FIGS. 7 to 20 are processing perspective views to show one embodiment of a method for fabricating a NAND flash memory array having a STAR structure according to the present invention. FIG. 21 is a perspective view to schematically show an array structure in FIG. 20. FIGS. 22 to 26 are processing perspective views to show another embodiment of a method for fabricating a NAND flash memory array having a STAR structure according to the present invention. The above drawings are illustrated to show a part of the repeated structures. However, because it is nothing but representative examples in order that ordinarily skilled artisan can understand and embody the present invention; it should not be applied to limit the scope of the claims.

[Embodiment on Semiconductor Device Structure]

As shown in FIG. 2 (ref. of FIG. 1), FIG. 4 (ref. of FIG. 3) or FIG. 6 (ref. of FIG. 5), one embodiment of a semiconductor device having a STAR structure according to the present invention, basically comprising: one or more stacked semiconductor layers 21 and 23 spaced vertically apart from a substrate by a predetermined distance; a gate electrode 50, 51, 52 or 53 formed to pass by all of the semiconductor layers and interlaid with a gate insulator 40, 41 or 42 on each of the semiconductor layers; source/drain regions 22 and 26 formed at both sides of the gate electrode in each of the semiconductor layers; and an interlayer insulator 60 wrapping around the source/drain regions of each of the semiconductor layers or filling a space between the semiconductor layers.

Therefore, this embodiment has characteristic points as the following:

As shown in FIG. 1, the semiconductor layers 21 and 23 as active regions are spaced vertically apart from a substrate 10 by a predetermined distance and have a structure stacked with one or more layers.

All the semiconductor layers 21 and 23 vertically stacked are connected by one gate electrode 50, 51, 52 or 53 interlaid with a gate insulator 40, 41 or 42.

The source and drain regions 22 and 26 are horizontally formed at left and right sides of the gate electrode.

The interlayer insulator 60 wrapping around the source and drain regions of each of the semiconductor layers (FIG. 4 or 6) or filling a space between the semiconductor layers (FIG. 2) is used to construct a field region for separating devices.

According to this embodiment, the channel width of a device can be enable to widen vertically (i.e., high efficiency devices can be embodied without any affect in integrity) and a plurality of semiconductor devices with a single gate (not shown), a double gate (FIG. 1) or a gate all around (GAA) structure wrapping around a channel region (FIG. 3 or 5) can be formed vertically.

For the above embodiment, a lateral cross section of each of the semiconductor layers 21 and 23 can be a quadrangle (of course, a square or a rectangle is possible), as shown in FIGS. 1 and 3, or a circle (of course, an ellipse is possible), as shown in FIG. 5.

Here, when the lateral cross section of each of the semiconductor layers 21, 23, 21a and 23a is a quadrangle, the gate electrode is preferable to cross each of the semiconductor layers at both lateral sides for forming the double gate structure, as the reference number 50 shown in FIG. 1, or to wrap around all four lateral sides for forming the gate all around (GAA) structure, as the reference number 51, 52 or 53 shown in FIG. 3. Also, the gate electrode can pass by to cross one lateral side of each of the semiconductor layers for forming the single gate structure (not shown).

On the other hand, when the cross section of each of the semiconductor layers is a circular or elliptical shape 21b or 23b, the gate electrode is preferable to wrap around all the lateral sides of each of the semiconductor layers for forming the gate all around (GAA) structure, as the reference number 51, 52 or 53 shown in FIG. 5.

Also, the gate insulator interlaid between each of the semiconductor layers and the gate electrode for insulation has a planar (i.e., a flat) structure 40, as shown in FIG. 1, when the gate electrode 50 passes by to cross each of the semiconductor layers 21 and 23. Or the gate insulator has a cubic structure 41 or a cylindrical structure 42 when the gate electrode 51, 52 or 53 passes by to wrap around each of the semiconductor layers 21a, 23a, 21b and 23b, as shown in FIGS. 3 and 5.

The source and drain regions 22 and 26 are preferable to be formed at one lateral side (not shown) or both lateral sides (FIG. 1) of each of the semiconductor layers 21 and 23 interlaying the gate electrode 50 or to be formed with a predetermined depth from all lateral sides of each of the semiconductor layers 21a, 23a, 21b and 23b in a structure of a gate electrode wrapping around each of the semiconductor layer (FIG. 3 or 5).

By the above configuration, a body region is formed in the other side except the source/drain regions 22 and 26 or in the inside of each of the semiconductor layers. As a result, it is possible that the body region is contacted to the outer part as a body contact and shared with adjacent devices (i.e., the devices are connected to the same semiconductor layers).

[Embodiment on NAND Flash Memory Array Structure]

One embodiment of a NAND flash memory array having a STAR structure according to the present invention is to use the above mentioned embodiment of a semiconductor device having a STAR structure.

Figure 20:
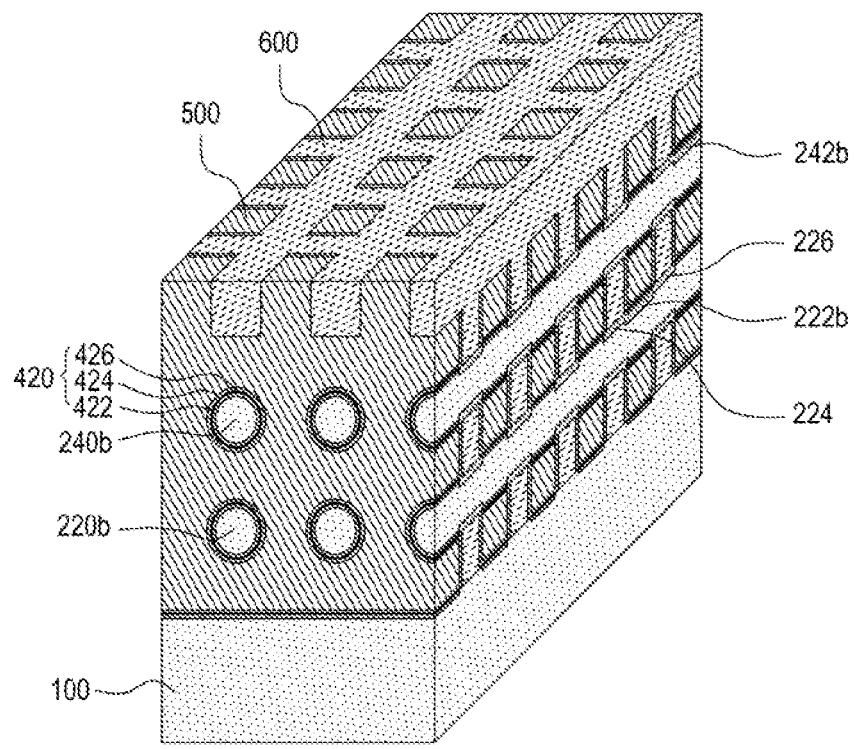
Figure 21:
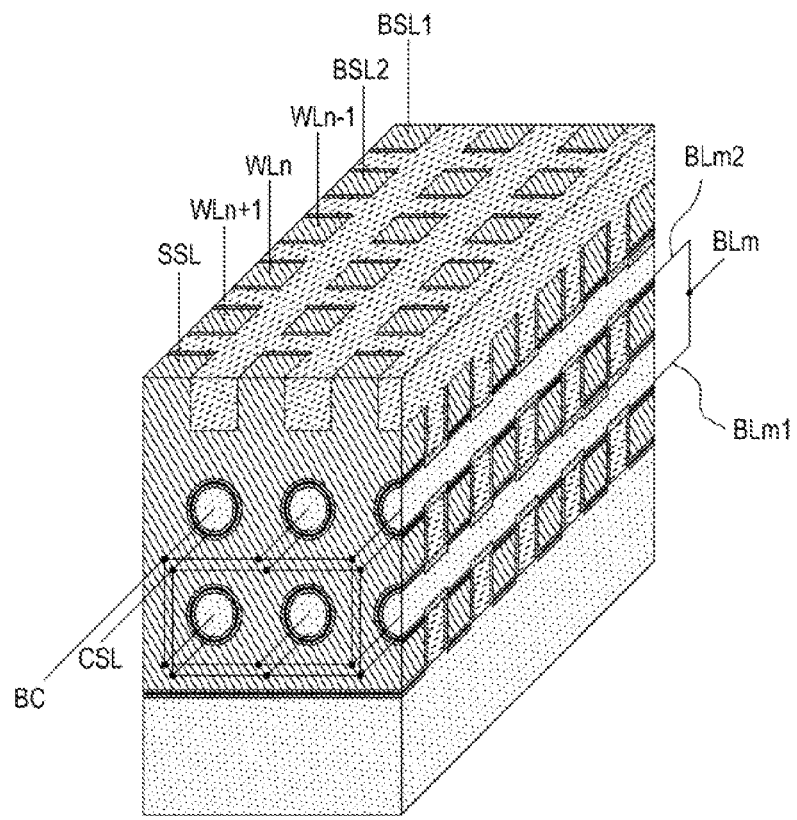
FIG. 21 is a perspective view to schematically show an array structure in FIG. 20.

And this embodiment is basically characterized, as shown in FIGS. 20 and 21, by comprising: a plurality of bit lines BLm, BLm1 and BLm2 formed with one or more stacked semiconductor layers 220b and 240b spaced vertically and horizontally apart from each other by a predetermined distance on a substrate; a plurality of word lines 500, WLn−1, WLn and WLn+1 formed perpendicularly to each of the bit lines, to space horizontally apart from each other by a predetermined distance and to wrap around the semiconductor layers 220b and 240b interlaid with insulator layers 420 comprising a charge storage layer 424; and an interlayer insulator 600 filled between the word lines.

As mentioned above, it is enable to allow unlimitedly the high integrity because bit lines are spaced vertically apart from the substrate 100 by a predetermined distance and formed one or more stacked layers (in other words, two or more bit lines are formed vertically). Additionally, it is possible greatly to reduce area of a word line operation driver due to the operation of several bit line layers of by one word line driver.

In each of the semiconductor layers 220b and 240b composing the plurality of bit lines BLm, BLm1 and BLm2, memory cells are formed at the points crossed with each of the word lines 500, WLn−1, WLn and WLn+1 and connected in series along each of the bit lines.

As shown in FIG. 20, the source/drain regions of the memory cell can be formed not only by impurity-doped layers 224 and 226 injected additionally to both sides of a word line 500, but also by fringing fields induced electrically by an adjacent word line supplied by pass voltage Vpass when the distance between the word lines is reduced within 50 nm.

Also, it is preferable that the lateral cross section of each of the semiconductor layers 220b and 240b passed by each of the word lines 500 interlaid with the insulator layer 420 is one shape selected from a quadrangle, a circle or an ellipse and that each of the word lines 500, as shown in FIG. 20, is passed by to wrap around the lateral side of each of the semiconductor layers 220b and 240b for forming the memory cells with the gate electrode all around (GAA) structure.

By the embodiment of the memory cells having the GAA structure, it is possible to improve the speed of program due to the high controllability to a channel of each cell and to solve the problem of program disturbance of adjacent cells by a self-boosting effect.

Specifically, as shown in FIG. 20, when the lateral cross section of each of the semiconductor layers 220b and 240b is a circle, insulator layers 420 comprising a charge storage layer 424 of each cell are formed to have different radii of curvature.

Figure 16:
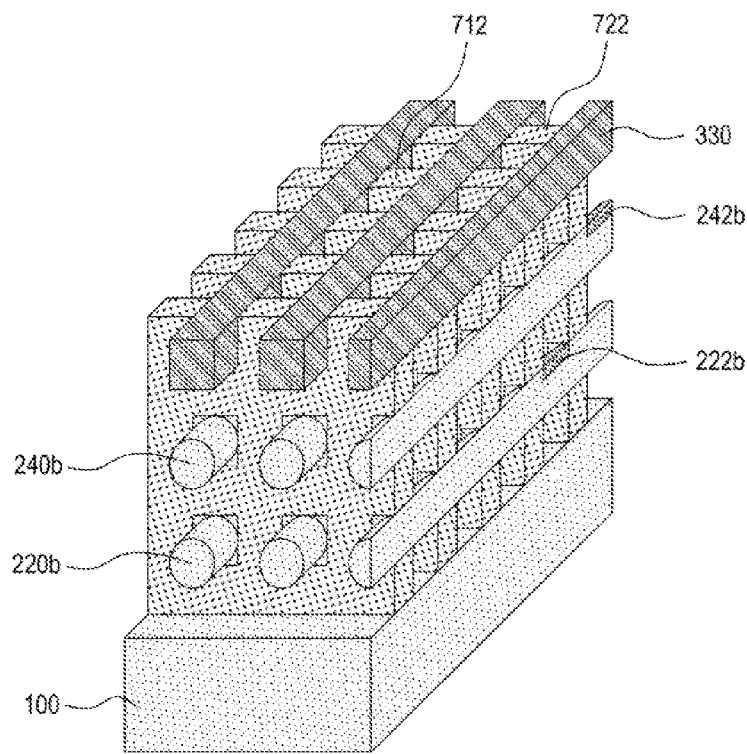
Figure 17:
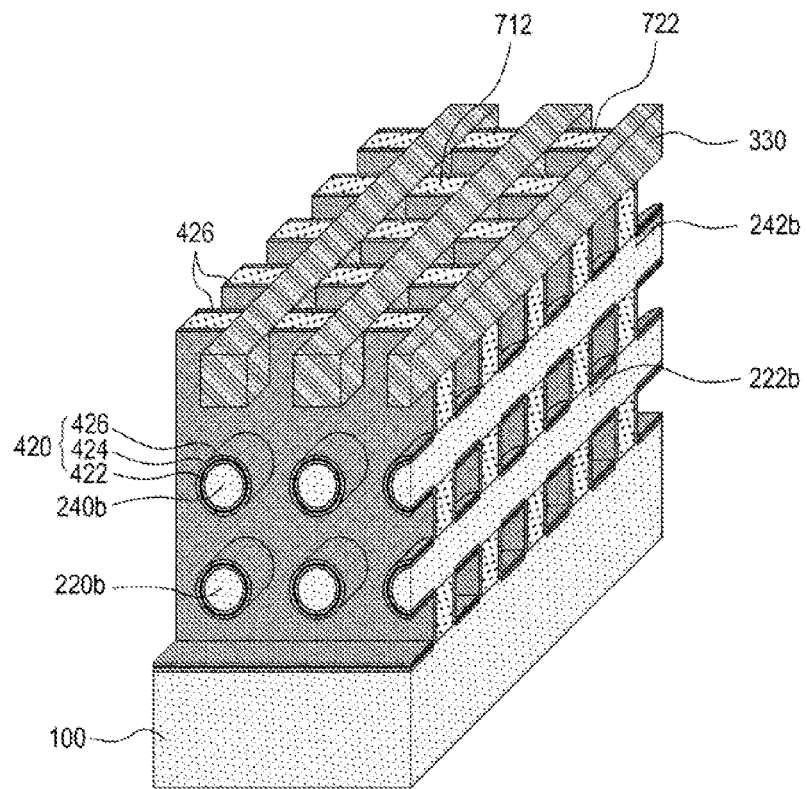

Namely, the insulator layers 420 are formed on each of the semiconductor layers 220b and 240b, as exposed structures shown in FIG. 16, by depositing sequentially a tunneling oxide film 422/charge storage layer 424/blocking oxide film 426, as shown in FIG. 17, to form the radius of curvature of outside surface of the blocking oxide film 426 contacted to the word line 500 relatively larger than that of inside surface of the tunneling oxide film 422. As a result, it is possible to greatly improve the erasing speed of the cell by restraining the back tunneling of electron through the blocking oxide film 426 during an erasing operation.

Here, the charge storage layer 424 can be formed with a charge trap material such as a nitride to form the memory cell as SONOS or TANOS structure. However, as shown in FIG. 16, since the insulator layers 420 are formed in the separated condition by the partitions 712 and 722, the charge storage layer 424 can be also formed by a conductive material (e.g., a metal) to form the memory cell having a floating gate structure.

Although one or more bit lines vertically stacked can be operated by independent operational drivers, as shown in FIG. 21, it is preferable to operate by one operational driver. In this case, it is preferable that the bit select lines BSL1 and BSL2 are further formed as many as the number of the vertically stacked semiconductor layers, spaced horizontally apart from each other by a predetermined distance, and wrapping around the one or more semiconductor layers 220b and 240b interlaid with the insulator layers 420 in one side of the plurality of word lines to turn on/off only each same layer BLm1 or BLm2 of the stacked bit lines BLm1 and BLm2.

To turn on/off each same layer bit lines (e.g., BLm1) of the vertically stacked bit lines, as shown in FIGS. 20 and 21, it is preferable that excepting the semiconductor layers (e.g., 220b and the other semiconductor layers horizontally parallel to 220b) in one same layer to turn on/off among all the vertically stacked semiconductor layers 220b and 240b, regions wrapping around the other semiconductor layers (e.g., 240b and the other semiconductor layers horizontally parallel to 240b) by each bit select line (e.g., BSL1) are formed with impurity-doped layers 242b.

Namely, it is preferable to make short circuits by the impurity-doped layers in the semiconductor layers excepting the same layer including a bit line (e.g., BLm1) to turn on/off by the each bit select line (e.g., BSL1).

As shown in FIG. 20, it is preferable that the impurity-doped layers for source/drain regions 224 and 226 as well as for the short circuits 222b and 242b are not formed till the center of each the semiconductor layers in order to have one common body region.

By the configuration, as shown in FIG. 21, each of the semiconductor layers enables to have a body contact (BC) through the common body region and it is possible to erase a block unit.

As shown in FIGS. 20 and 21, a source select line SSL is further formed to wrap around the one or more semiconductor layers 220b and 240b interlaid with the insulator layers 420 at the other side of the plurality of word lines (e.g., at opposite BSLs in FIG. 21). By using the source select line SSL, it is possible to control the bit lines to electrically connect to a common source line CSL.

[Embodiment 1 on Method for Fabricating NAND Flash Memory Array]

Figure 10:
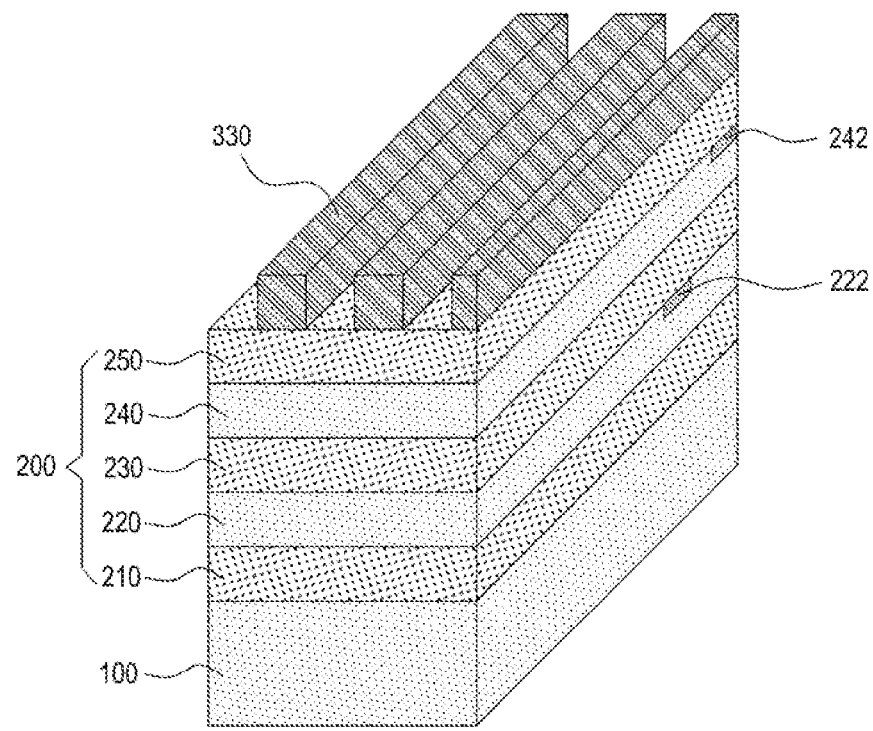

For embodiments of a method for fabricating a NAND flash memory array having a STAR structure according to the present invention, first methods for fabricating bit lines and word lines required commonly are described with respect to FIGS. 10 to 20 as follows:

First, as shown in FIG. 10, "a semiconductor layer 220 on a stack mediate layer 210" is formed iteratively n times (for convenience, FIG. 10 shows only 2 times repeated formation) on a predetermined substrate 100, an n+1$^{th}$ stack mediate layer (in FIG. 10, 3$^{rd}$ stack mediate layer 250) is formed on the n$^{th}$ semiconductor layer (in FIG. 10, 2$^{nd}$ semiconductor layer 240), and a first etching mask 330 is formed on the n+1$^{th}$ stack mediate layer 250 (step 1).

Here, the stack mediate layers 210, 230 and 250 and the semiconductor layers 220 and 240 are preferably stacked by the epitaxial method for growing a single crystal.

The stack mediate layers 210, 230 and 250 are to space apart the semiconductor layers 220 and 240 from the substrate 100 by a predetermined distant for stacking vertically and to be removed by etching to fill with the interlayer insulator 600 for insulating electrically each of the semiconductor layers.

Therefore, the stack mediate layers 210, 230 and 250 can be made of any material if having a lattice structure similar to those of the semiconductor layers 220 and 240 to be easily stacked by epitaxial method and an etching selectivity larger than that of the material of the semiconductor layers 220 and 240.

For example, when the materials of the substrate 100 and the semiconductor layers 220 and 240 are silicon (Si), the material of the stack mediate layers 210, 230 and 250 is preferable to be silicon germanium (SiGe).

Also, the material of the first etching mask 330 can be made of any material if having an etching selectivity larger than those of the materials of the stack mediate layers 210, 230 and 250 and the semiconductor layers 220 and 240. Thus, when the materials of the stack mediate layers 210, 230 and 250 and the semiconductor layers 220 and 240 respectively are silicon germanium (SiGe) and silicon (Si), the material of the first etching mask 330 is preferable to be a nitride.

In the n times repeated formation of "a semiconductor layer 220 on a stack mediate layer 210", if n=1, an array with a mono layer of bit line spaced apart from the substrate 100 by a predetermined distance can be formed and if n=2 or more, an array with a vertical stack of a plurality of bit lines can be formed.

Figure 11:
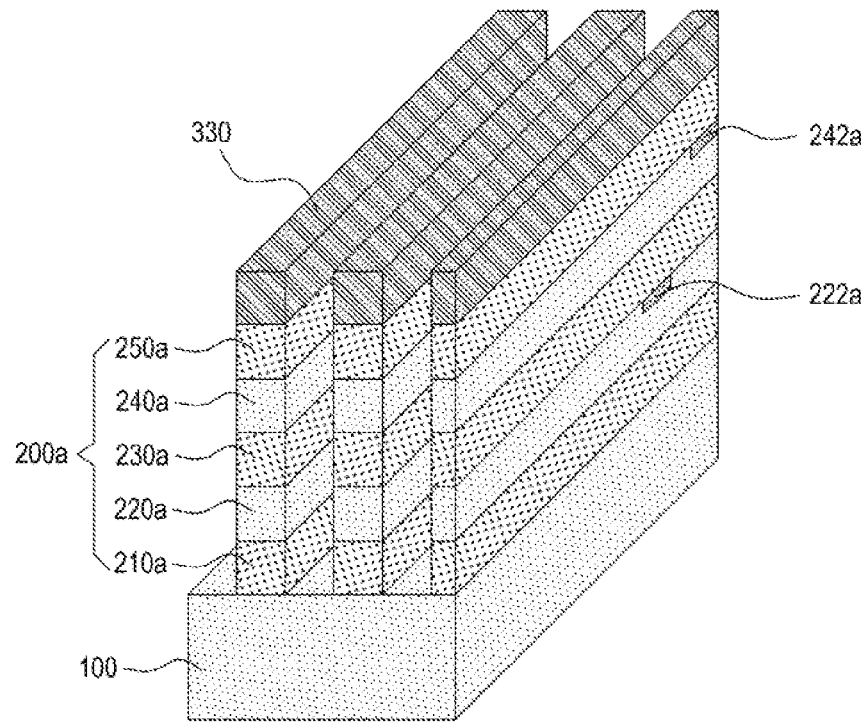

Next, as shown in FIG. 11, using the first etching mask 330, the n times stacked "semiconductor layer/stack mediate layer" is sequentially etched from the n+1$^{th}$ stack mediate layer 250 to form the bit lines having a pillar-shaped stack structure 200a (step 2).

Here, in the formation of the pillar-shaped stack structure 200a, the 1$^{st}$ stack mediate layer 210 provides a process margin of the etching. Namely, there is a process margin to control process conditions by no over-etching of the 1$^{st}$ stack mediate layer 210 in the etching process.

Figure 12:
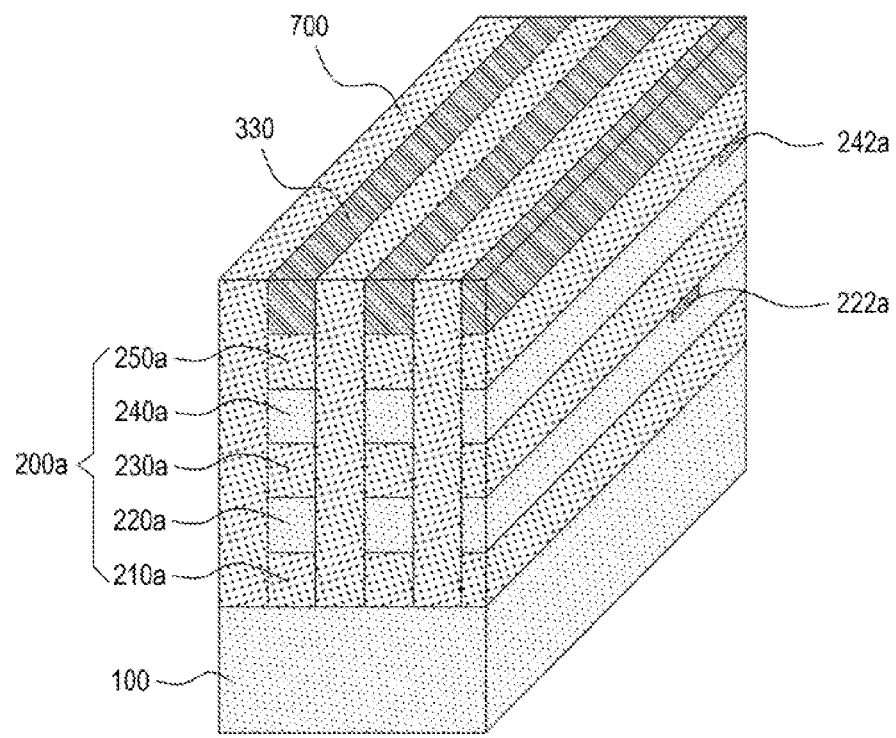
Figure 13:
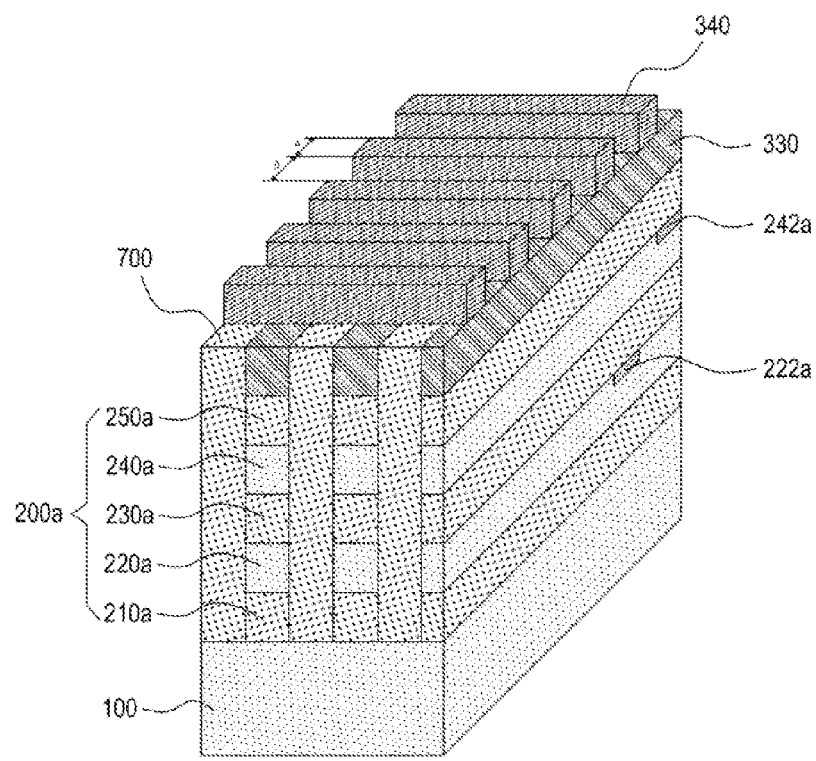

Next, as shown in FIG. 12, a groove filling material 700 is deposited on the whole surface substrate, planarized to expose the first etching mask 330, and, as shown in FIG. 13, a second etching mask 340 is formed (step 3).

Here, the groove filling material 700 is preferable to be a material having an etching rate (i.e., an etching selectivity) equal to or similar to that of the material of the stack mediate layers 210a, 230a and 250a. When the substrate 100 and the semiconductor layers 220a and 240a are silicon (Si), the stack mediate layers 210a, 230a and 250a and the groove filling material 700 are more preferable to be silicon germanium (SiGe).

If the first etching mask 330 is made of a nitride, the planarization process is preferable to be the known CMP process using the first etching mask 330 as an etching stopper.

In the formation of the second etching mask 340, the width A of the mask is preferable to be larger than the interval B between the openings of the mask, or the bottom width of the mask is preferable to be larger than the upper width of the mask by using a slope etching method.

Specifically, the latter has a merit to form the narrower interval between the openings of the second etching mask 340 even though using a photolithography with the same resolution.

This reason is that the interval B between the openings of the second etching mask 340 is needed only to expose the groove filling material 700 and to etch for forming partitions 710 and 720, and that the more etching the partitions 710 and 720 formed the groove filling material 700 forms the narrower width of the partitions 710 and 720 and the wider interval between partitions 710 and 720.

Figure 14:
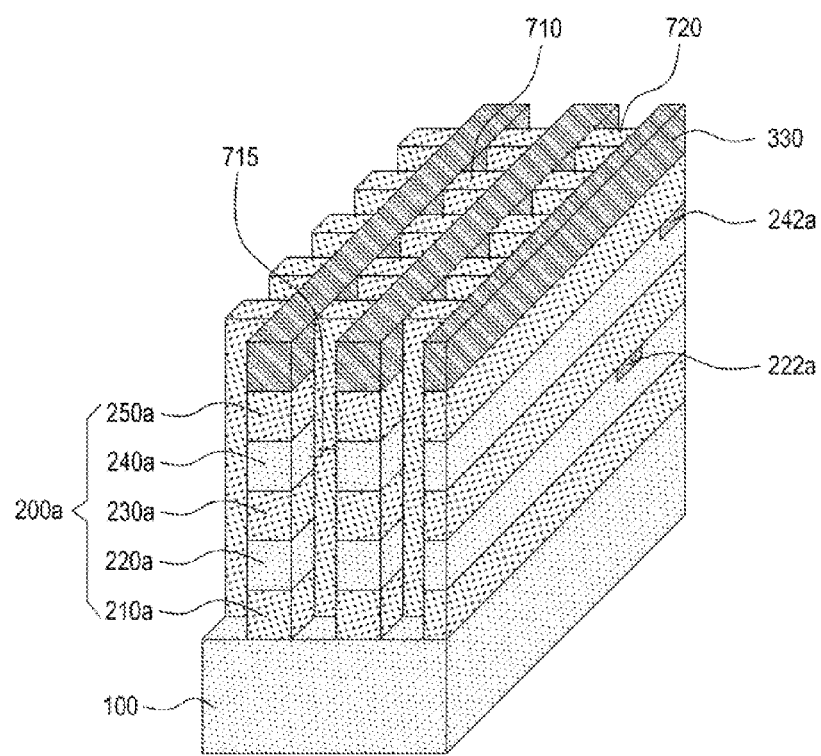

Next, as shown in FIG. 14, using the second etching mask 340, the groove filling material 700 exposed between the openings of the second etching masks is etched to form the partitions 710 and 720 at both sides of the groove 715, exposing the portions 210a, 220a, 230a, 240a and 250a of the stacked structures 200a and 330 of step 2 at both sides of the partitions, and the second etching mask 340 is removed (step 4).

At this time, the formation of the partitions 710 and 720 is preferable to use an anisotropic etching for vertically etching the groove filling material 700 exposed between the openings of the second etching mask 340.

Figure 15:
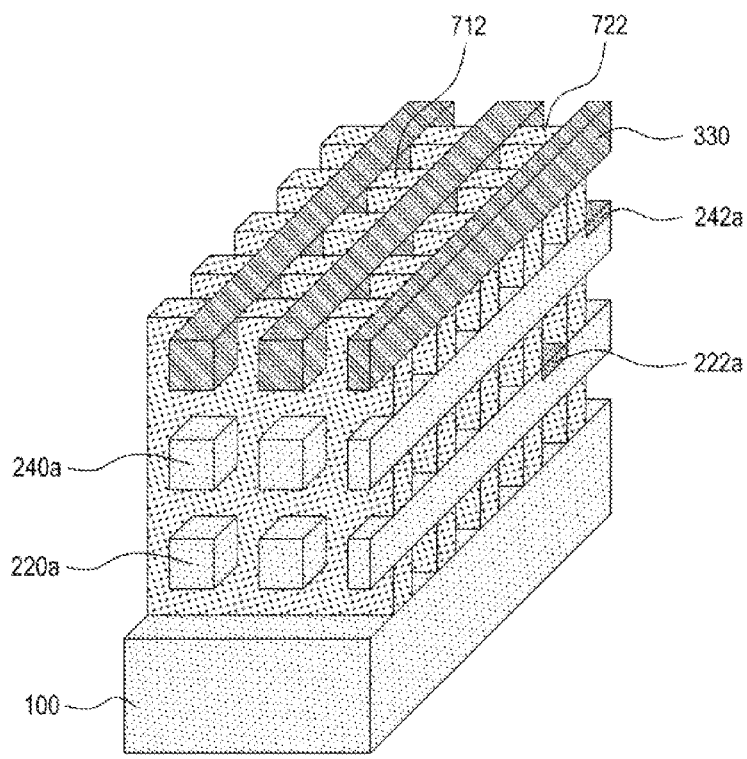

Next, as shown in FIG. 15, the exposed stack mediate layers 210a, 230a and 250a are etched to expose only the first etching mask 330 and the semiconductor layers 220a and 240a at both sides of the partitions 712 and 722 (step 5).

Here, the etching of the exposed stack mediate layers 210a, 230a and 250a is preferable to use an isotropic etching to also etch the portion of the partitions 710 and 720 formed the groove filling material 700.

In the above case, the groove filling material 700 is equal to the material of the stack meditate layers 210a, 230a and 250a (e.g., silicon germanium) or has an etching rate similar to that of.

As shown in FIG. 15, when the groove filling material 700 is equal to the material of stack meditate layers 210a, 230a and 250a (e.g., silicon germanium), the partitions 712 and 722 are formed to wrap around each of the semiconductor layers 220a and 240a.

Next, as shown in FIG. 17, insulator layers 420 are formed on the semiconductor layers 220b and 240b exposed at both sides of the partitions 712 and 722 (step 6).

The formation of the insulator layers 420 is sequentially processed, for example, a formation of a tunneling oxide layer 422, a charge storage layer 424 and a block oxide layer 426. When the charge storage layer 424 is formed with a charge trap material (e.g., a nitride), the memory cells can be formed as a SONOS or TANOS structure. As shown in FIG. 15 or 16, because the insulator layers 420 are separated by the partitions 712 and 722, the memory cells can be formed with a floating gate structure when the charge storage layer 424 is a conductive material (e.g., a metal).

When thermal oxidation process is used to form the insulator layers 420, the tunneling oxide layer 422 and/or the blocking oxide layer 426 can be formed on the partitions 712 and 722 of a silicon containing material (e.g., silicon germanium) as well as on the silicon substrate 100.

Consequently, as shown in FIG. 17, the insulator layers 420 are formed on the whole surface of the exposed structure.

Figure 18:
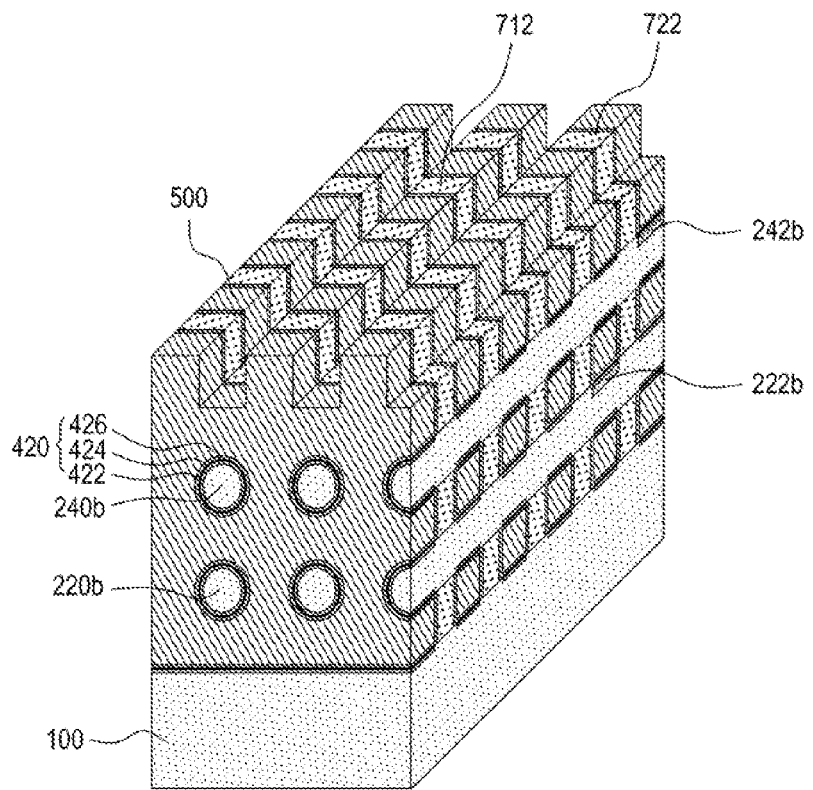

Next, as shown in FIG. 18, a gate material is deposited on the whole surface of the substrate, planarized to expose the first etching mask 330, and word lines 500 are formed by removing the first etching mask 330 (step 7).

In the deposition of the gate material, a silicon containing material (such as a doped polysilicon) or a metal is used to fill between the partitions 712 and 722 for wrapping around each of the semiconductor layers 220b and 240b on which the insulator layers 420 are formed.

Figure 19:
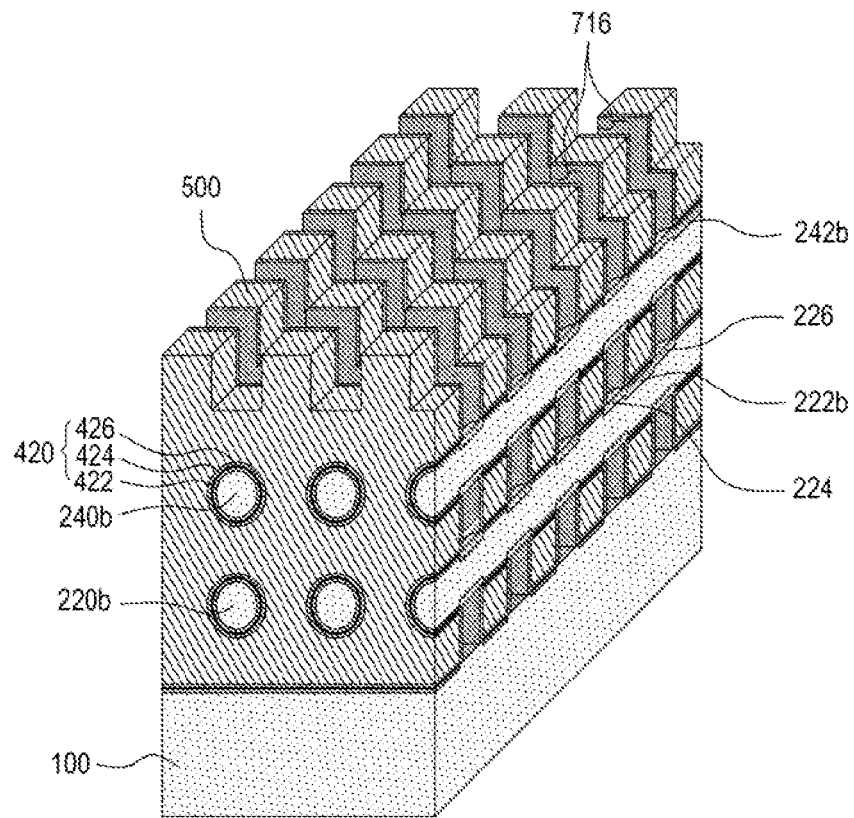

Next, as shown in FIG. 19, the partitions 712 and 722 are removed to expose empty spaces 716, and the empty spaces 716 are filled with an interlayer insulator 600 (when source/drain regions of cell are formed by fringing fields). Or the source/drain impurity-doped layers 224 and 226 are further formed on each of the semiconductor layers 220b and 240b exposed by removing the partitions and the interlayer insulator 600 is filled as shown in FIG. 20 (step 8).

Here, when the source/drain regions of cell are formed by fringing fields, the process is preferable to sequentially proceed as follows: removing the partitions 712 and 722, forming a separating insulator (not shown) including the charge storage layer on each of the preformed word lines and on the exposed semiconductor layers by thermal oxidation process and/or CVD process, depositing a gate material on the whole surface of the substrate and then planarizing the gate material to separate the gate electrodes (in other words, to separate the word lines).

In other words, it is preferable to fill with a gate material instead of the interlayer insulator 600 in the empty spaces formed by removing the partitions 712 and 722 between the preformed word lines 500 and to further form additional word lines which wrap around the semiconductor layers interlaid with the separating insulator (not shown) for increasing the integrity and enabling the operation of cell by fringing fields.

In the formation of the source/drain regions by the impurity doping, it is preferable to use epitaxial method or plasma process.

Also, as shown in FIG. 19, it is preferable to form a body region in the inside of each of the semiconductor layers by injecting the impurity to wrap around the outside surface of each of the semiconductor layers exposed by the removing the partitions in an ion implantation.

Additionally, it is preferable that the insulator layers 420 formed on the side of the partitions 712 and 722 are removed and then the ion implantation is performed to also inject the impurity ions in the word lines 500 formed of a silicon containing material.

[Embodiment 2 on Method for Fabricating NAND Flash Memory Array]

This embodiment is performed as like as Embodiment 1 but, between steps 5 and 6, a curving process is further added to curve the surfaces of the semiconductor layers, as reference numbers 220b and 240b shown in FIG. 16, exposed at both sides of the partitions 712 and 722.

By the curving process, the further processes are proceeded as follows: forming cylindrical insulator layers 420 on the cylindrical semiconductor layers 220b and 240b (as shown in FIG. 17), forming the word lines 500 by depositing a gate material to wrap around the cylindrical insulator layers 420 between the partitions 712 and 722 (as shown in FIG. 18), removing the partitions 712 and 722 and then filling the empty spaces with the interlayer insulator 600 (when the source/drain regions of cell are formed by fringing fields) or forming the impurity-doped layers to form the source/drain regions 224 and 226 on each of the semiconductor layers exposed by removing the partitions 712 and 722 (as shown in FIG. 19) and filling the empty spaces 716 with the interlayer insulator 600 to fabricate a NAND flash memory array having a STAR structure (shown in FIGS. 20 and 21).

The advantages of the above mentioned method are the formation of the cylindrical semiconductor layers 220b and 240b, the cylindrical insulator layers 420 and the word lines wrapping around the cylindrical insulator layers 420 between the partitions 712 and 722.

Here, as shown in FIG. 16, the surfaces of the semiconductor layers 220b and 240b exposed at both sides of the partitions 712 and 722 can be curved, as reference numbers 200b and 240b shown in FIG. 16, by using the hydrogen annealing process or repeatedly the oxidation inducing a silicon aggression and oxide layer etching processes.

The other processes are equal to Embodiment 1 and not described here.

[Embodiment 3 on Method for Fabricating NAND Flash Memory Array]

This embodiment relates mainly to a fabricating method for formation of impurity-doped layers for short circuit and of bit select lines. This embodiment comprises a fabricating method according to Embodiment 1 or 2 and additional processes as the following: forming a short-circuit impurity-doped layer 222 or 242 in the semiconductor layer exposed by the opening of a doping mask 310 or 320 formed to have a different opening site per formation of "semiconductor layer on stack mediate layer" in step 1 as shown in FIGS. 8 and 9, and simultaneously forming bit select lines BSL1 and BSL2 as many as the number (n) of the stacked semiconductor layers to pass by the short-circuit impurity-doped layers 222 and 242 at forming the word lines in step 7.

Figure 7:
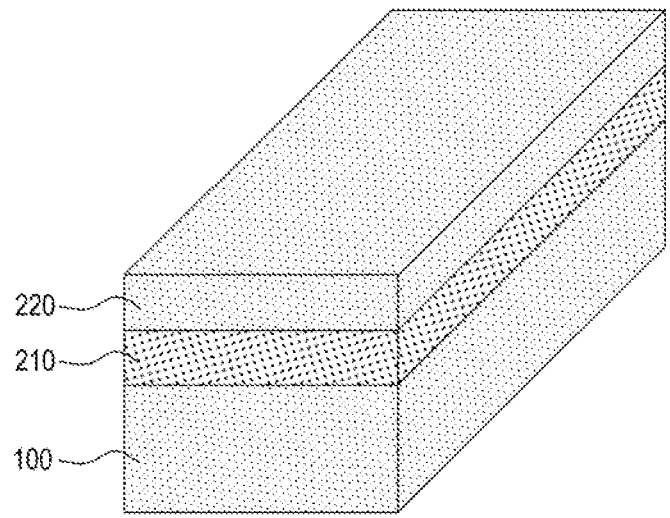
FIGS. 7 to 20 are processing perspective views to show one embodiment of a method for fabricating a NAND flash memory array having a STAR structure according to the present invention.
Figure 8:
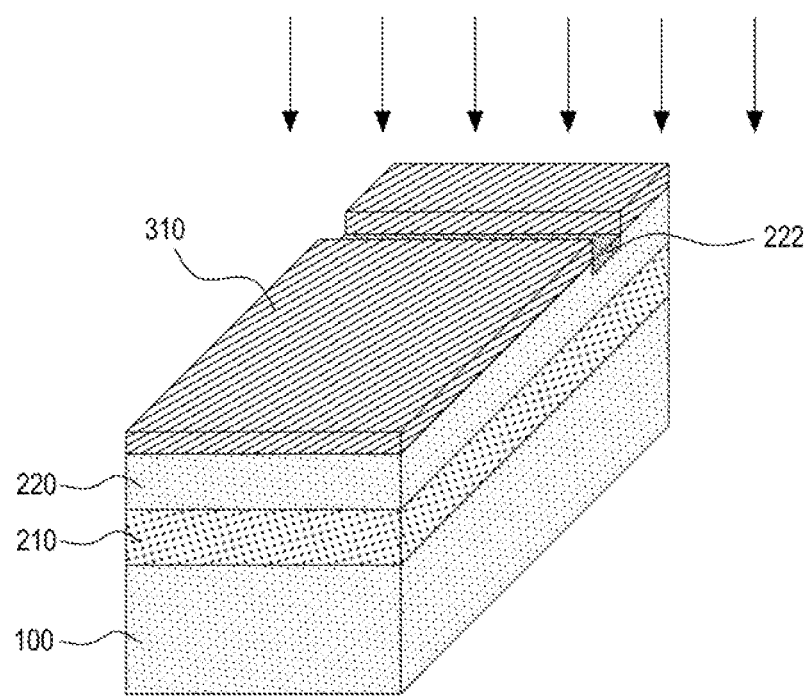

In other words, as shown in FIG. 7, after formation of the "semiconductor layer 220/stack mediate layer 210" on the substrate 100, as shown in FIG. 8, a first doping mask 310 is formed to have an opening at one side by a photoresist (PR) and then the short-circuit impurity-doped layer 222 is formed in the first semiconductor layer 220 by using the first doping mask 310 through an ion implantation process.

Figure 9:
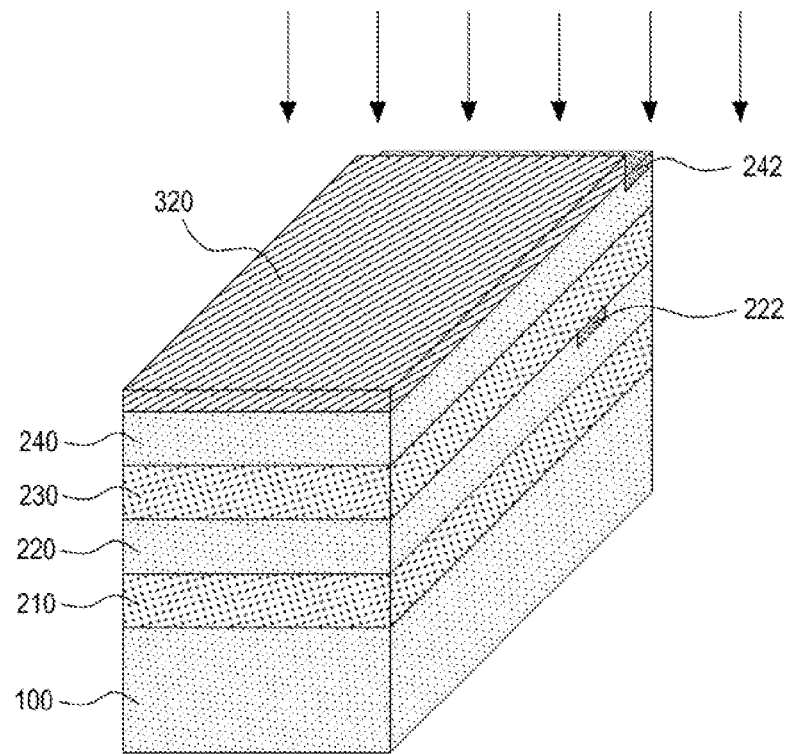

Next, the first doping mask 310 is removed, as shown in FIG. 9, a second "semiconductor layer 230/stack mediate layer 240" is formed, a second doping mask 320 with an opening at a different site is formed by a photoresist (PR) and then the short-circuit impurity-doped layer 242 is formed in the second semiconductor layer 240 by using the second doping mask 320 through an ion implantation process.

Using the above mentioned method, a doping mask with an opening at different site is repeatedly formed at every formation of the "semiconductor layer/stack mediate layer" and then a short-circuit impurity-doped layer is formed at different site in the $n^{th}$ of semiconductor layer by using the doping mask.

At this time, it is preferable to form the short-circuit impurity-doped layers 222 and 242 with a predetermined depth for remaining the impurity-doped layers only in the upper side of lateral sides of the semiconductor layers 220b and 240b, as shown in FIG. 16, to form one body region inside of each of the semiconductor layers 220b and 240b.

As shown in FIGS. 18 and 21, at the formation of word lines in step 7, the bit select lines BSL1 and BSL2 are simultaneously formed as many as the number (n) of the stacked semiconductor layers to pass by the short-circuit impurity-doped layers 222b and 242b.

The other processes are the same as Embodiment 1 and not described here.

[Embodiment 4 on Method for Fabricating NAND Flash Memory Array]

This embodiment relates mainly to another fabricating method for short-circuit impurity-doped layers and bit select lines. This embodiment comprises a fabricating method according to Embodiment 1 or 2 and additional processes below.

Figure 22:
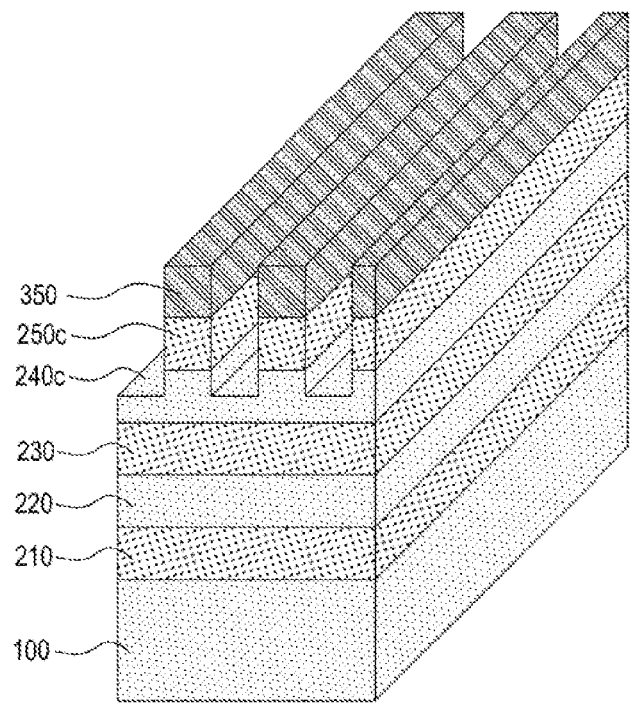
FIGS. 22 to 26 are processing perspective views to show another embodiment of a method for fabricating a NAND flash memory array having a STAR structure according to the present invention.
Figure 23:
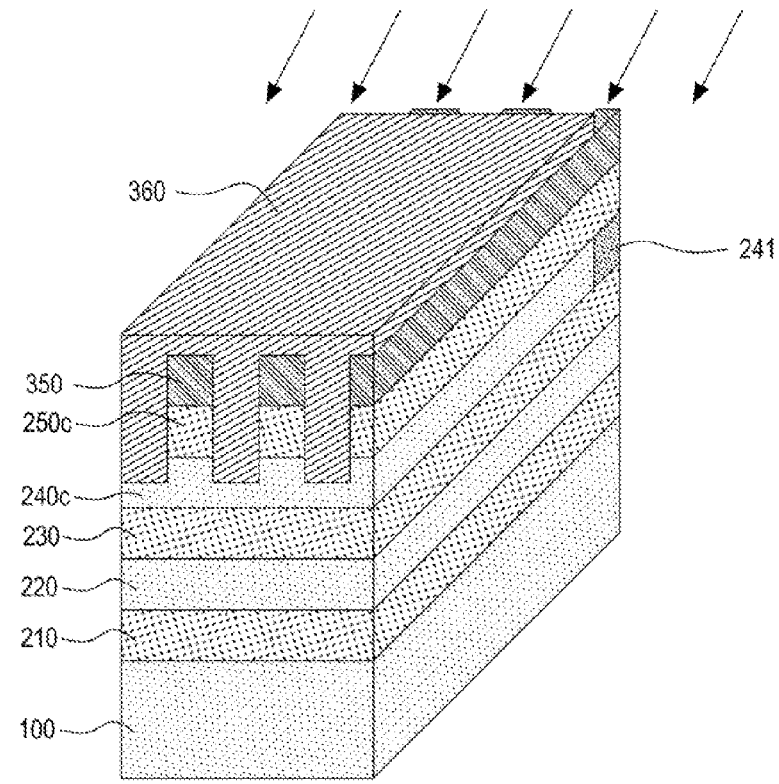
Figure 24:
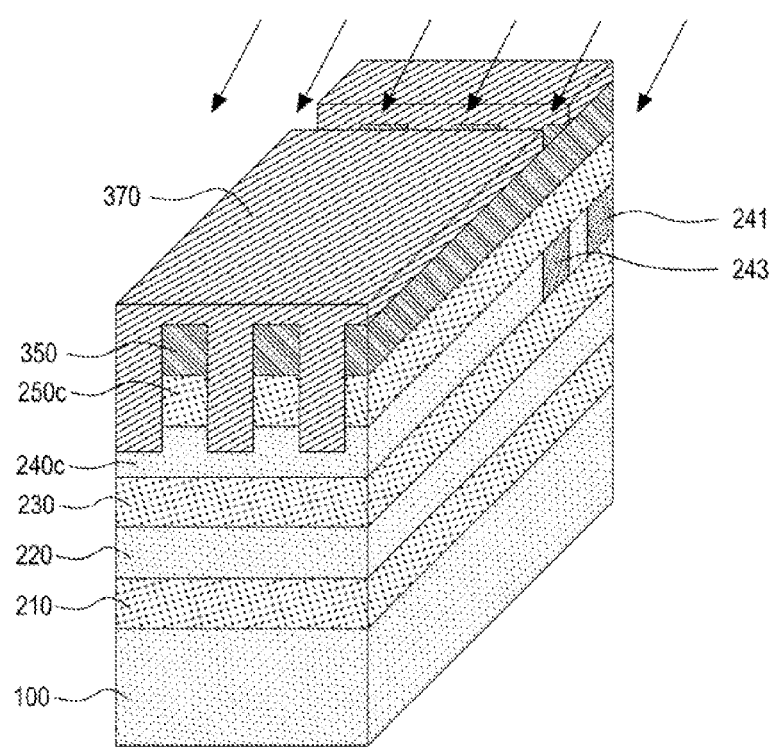
Figure 25:
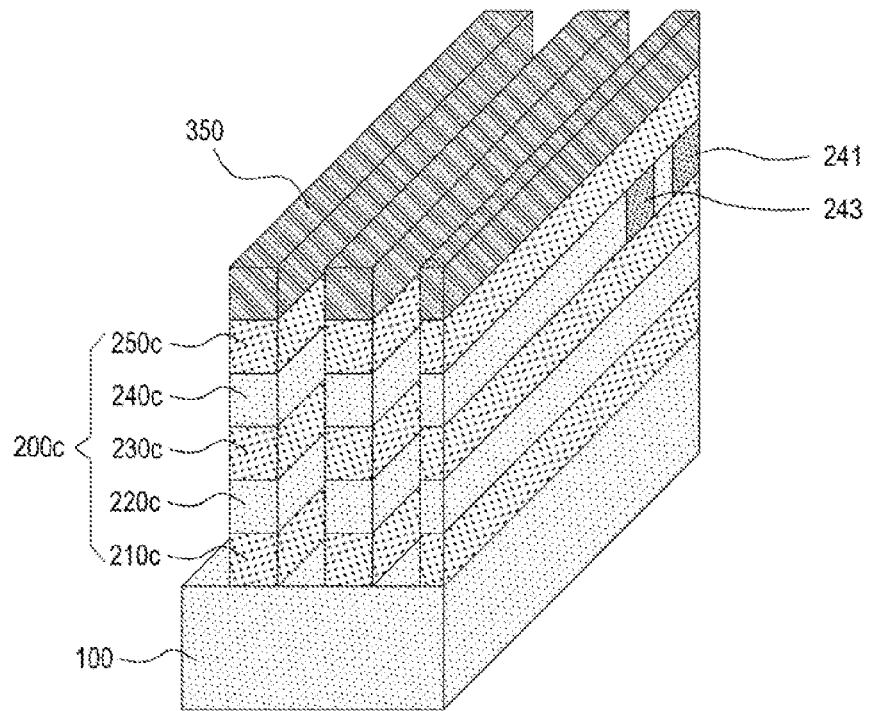
Figure 26:
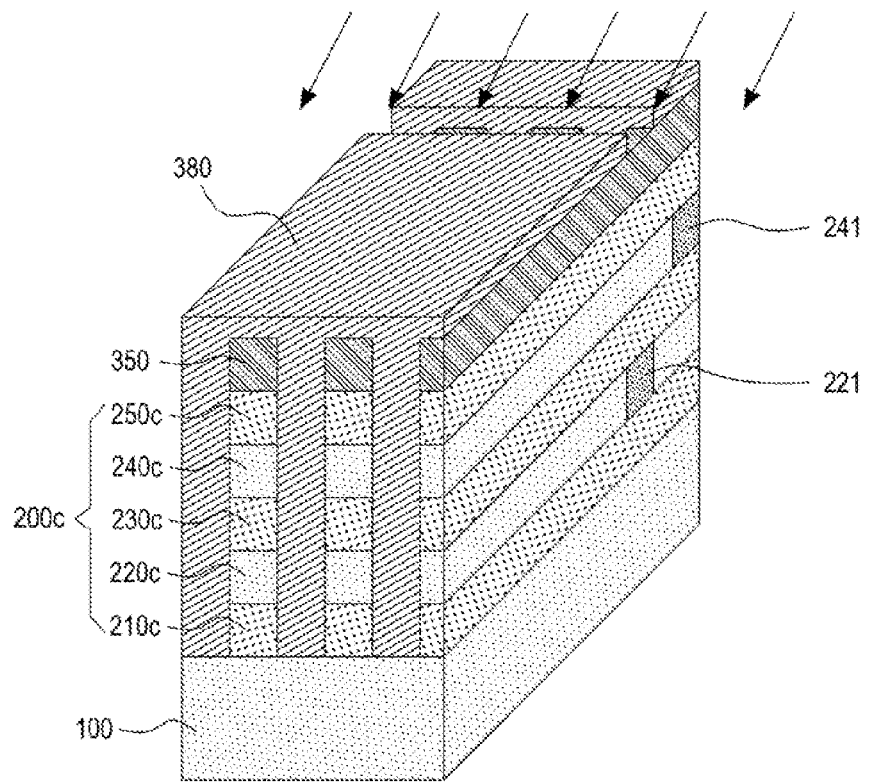

At forming the bit lines in step2, first impurity-doped layers 221 and 241 for short circuit are further formed at a different site per each of the semiconductor layers 220c and 240c by repeating the followings: etching the $n^{th}$ stacked "semiconductor layer 240c/stack mediate layer 230" to expose the semiconductor layer 240c by the first etching mask 350 as shown in FIG. 22, forming the first impurity-doped layer 241 by the $n^{th}$ doping mask 360 as shown in FIG. 23, forming a second impurity-doped layer 243 by the n–$1^{th}$ doping mask 370 at a neighbor site of the first impurity-doped layer 241 as shown in FIG. 24, etching the n–$1^{th}$ stacked "semiconductor layer 220c/stack mediate layer 210c" to expose the semiconductor layer 220c by the first etching mask 350 as shown in FIG. 25, forming the first impurity-doped layer 221 by a mask 380 formed with an opening at the same site as that of the n–$1^{th}$ doping mask 370 as shown in FIG. 26, and forming a second impurity-doped layer by the n–$2^{th}$ doping mask (not shown) at a neighbor site of the preformed first impurity-doped layer.

And at forming the word lines in step 7, bit select lines BSL1 and BSL2 respectively passing by the first impurity-doped layers 221 and 241 for short circuit are simultaneously formed as many as the number of the semiconductor layers.

Here, the reason of previously forming the second impurity-doped (e.g., P-type impurity) layer 243 is to restrain the formation of short-circuit first impurity-doped (e.g., N-type impurity) layer in the unwanted semiconductor layer (e.g., 240c layer) at forming short-circuit first impurity-doped (e.g., N-type impurity) layer 221 in the next semiconductor layer 220c. In other words, the unwanted region is firstly doped with P-type impurity and then doped with N-type impurity to restrain the formation of the short-circuit N-type impurity-doped layer.

At this time, it is preferable to inject the impurities with a predetermined slope in the vertically stacked pillar-shaped structure and to restrain to dope the whole inside of each of the semiconductor layers 220c and 240c. Namely, the short-circuit first impurity-doped layers 221 and 241 respectively are preferable to form within a predetermined depth from outside surface of each semiconductor layer for forming one body region in the inside of each of the semiconductor layers 220c and 240c.

Next, at forming the word lines in step 7, bit select lines BSL1 and BSL2 are simultaneously formed as many as the number (n) of the stacked semiconductor layers to pass by the short-circuit first impurity-doped layers 221 and 241 (not shown).

The other processes are the same as Embodiment 1 and not described here.

INDUSTRIAL APPLICABILITY

A semiconductor device having a stacked array (STAR) structure according to the present invention enables to have a vertical channel to widen the width of a channel and, as occasion demands, to be formed with a single gate (SG), double gate (DG) or gate all around (GAA) structure for being applicable to a basic memory cell of various types of memory array as well as a high-performance switch device.

Also, a NAND flash memory array having a STAR structure according to the present invention enables to allow a high integrity under a given process situation because bit lines are stacked vertically, a reduction of area of the word line operational drivers because one word line driver is able to operate several bit line layers simultaneously, increasing the speed of programs by improving controllability to a channel of each memory cell of word line, solving the problem of program disturbance of adjacent cells by a self-boosting effect, greatly improving the erasing speed of memory by restraining the back tunneling of electron, and fabricating by using the process facilities existing in the industry.

The invention claimed is:

1. A semiconductor device with a stacked array structure, comprising:
   two or more semiconductor layers vertically stacked and spaced apart from a substrate by a predetermined distance, the semiconductor layers running parallel to each other and to the substrate in a horizontal direction;
   a gate electrode vertically crossing all of the semiconductor layers with a gate insulator interposed between the gate electrode and each of the semiconductor layers;
   source/drain regions formed at both sides of the gate electrode in each of the semiconductor layers; and
   an interlayer insulator wrapping around the source/drain regions of each of the semiconductor layers or filling a space between the semiconductor layers.

2. The semiconductor device of claim 1, wherein each of the semiconductor layers has a lateral cross section of a shape selected from a quadrangle, a circle and an ellipse.

3. A NAND flash memory array, comprising:
   a plurality of bit lines formed with four or more semiconductor layers vertically and horizontally stacked and spaced apart from each other by a predetermined distance on a substrate, the semiconductor layers running parallel to each other and to the substrate in a horizontal direction;
   a plurality of word lines formed with two or more gate electrodes vertically crossing and wrapping around the semiconductor layers with insulator layers interposed between each of the gate electrodes and each of the semiconductor layers, the gate electrodes being spaced horizontally apart from each other, the insulator layers comprising a charge storage layer; and
   an interlayer insulator filled between the word lines, the interlayer insulator wrapping around source/drain regions of each of the semiconductor layers.

4. The NAND flash memory array of claim 3, wherein the source/drain regions are formed by impurity-doped layers or fringing fields at both sides of each of the word lines.

5. The NAND flash memory array of claim 4, wherein:
   each of the semiconductor layers has a lateral cross section of a shape selected from a quadrangle, a circle and an ellipse; and
   each of the word lines passes by to wrap around all lateral sides of each of the semiconductor layers.

6. The NAND flash memory array of claim 5, wherein:
   bit select lines are further formed as many as the number of the vertically stacked semiconductor layers at one side of the word lines to be spaced horizontally apart from each other by a predetermined distance and to wrap around the semiconductor layers with the insulator layers or a gate insulator interposed between each of the bit select lines and each of the semiconductor layers; and
   a source select line is further formed at the other side of the word lines to wrap around the semiconductor layers with the insulator layers or a gate insulator interposed between the source select line and each of the semiconductor layers.

7. The NAND flash memory array of claim 6, wherein the portions of the semiconductor layers wrapped around by each of the bit select lines are doped with an impurity to make short circuits except portions of the same one layer to be selected by each of the bit select lines.

8. The NAND flash memory array of claim 7, wherein the impurity-doped layers for the source/drain regions and short circuits are not formed until the center of each of the semiconductor layers has one common body region.

9. The NAND flash memory array of claim 8, wherein the insulator layers comprises a tunneling oxide film, a charge storage layer and a blocking oxide film stacked over each other in this order on each of the semiconductor layers, the charge storage layer being a nitride layer or a conductive material layer.

10. The NAND flash memory array of claim 3, wherein:
    each of the semiconductor layers has a lateral cross section of a shape selected from a quadrangle, a circle and an ellipse; and
    each of the word lines passes by to wrap around all lateral sides of each of the semiconductor layers.

11. The NAND flash memory array of claim 10, wherein:
    bit select lines are further formed as many as the number of the vertically stacked semiconductor layers at one side of the word lines and are spaced horizontally apart from each other by a predetermined distance and wrap around the semiconductor layers with the insulator layers or a gate insulator interposed between each of the bit select lines and each of the semiconductor layers; and
    a source select line is further formed at the other side of the word lines to wrap around the semiconductor layers with the insulator layers or a gate insulator interposed between the source select line and each of the semiconductor layers.

12. The NAND flash memory array of claim 11, wherein the portions of the semiconductor layers wrapped around by each of the bit select lines are doped with an impurity to make short circuits except portions of the same one layer to be selected by each of the bit select lines.

13. The NAND flash memory array of claim 12, wherein the impurity-doped layers for the source/drain regions and short circuits are not formed until the center of each of the semiconductor layers has one common body region.

14. The NAND flash memory array of claim 13, wherein the insulator layers comprises a tunneling oxide film, a charge storage layer and a blocking oxide film stacked over each other in this order on each of the semiconductor layers, the charge storage layer being a nitride layer or a conductive material layer.

* * * * *